US006476957B1

(12) United States Patent
Ward et al.

(10) Patent No.: US 6,476,957 B1
(45) Date of Patent: Nov. 5, 2002

(54) IMAGE REJECTING MICROWAVE PHOTONIC DOWNCONVERTER

(75) Inventors: Allan Ward, Alexandria, VA (US); Keith J. Williams, Accokeek, MD (US); Paul D. Biernacki, Alexandria, VA (US); Lee T. Nichols, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 90 days.

(21) Appl. No.: 09/620,324

(22) Filed: Jul. 17, 2000

(51) Int. Cl.[7] .............................. G02F 1/35; H01P 1/00
(52) U.S. Cl. ........................ 359/326; 333/167; 333/176
(58) Field of Search ................................ 359/325–332; 333/167, 175, 176, 218

(56) References Cited

U.S. PATENT DOCUMENTS

| 4,794,351 | A | * | 12/1988 | Darcie | 359/245 |
| 5,016,242 | A | * | 5/1991 | Tang | 359/124 |
| 5,617,239 | A | * | 4/1997 | Walker | 359/181 |
| 6,043,926 | A | * | 3/2000 | Williams | 359/326 |

OTHER PUBLICATIONS

Ward et al, "An Ultrawideband Image Rejecting Microwave Downconverter Using WDM", 1999 International Topical Meeting on Microwave Photonics (MWP '99), vol. 1, pp. 239–242, Paper F–9.6, Melbourne, Australia, Nov. 17–19, 1999.*
Strutz et al, "Demonstration Of A Wide–Band Image Rejection Microwave Downconverter", IEEE Photonics Technology Letters, vol. 12, No. 6, Jun. 2000, pp. 687–689.*
Cumming, The Serrodyne Frequency Translator; Proc. of th IRE, vol. 45, p. 175; 1957.
Ward et al.; An Ultrawideband Image Rejecting Microwave Downconverter Using WDM—MWP '99 Digest—pp. 239–242; Nov. 15, 1999.
Chao et al., Photonic Mixers and Image–Rejection Mixers for Optical SCM Systems; IEEE Trans. on Micro. Theo. and Tech.; vol. 45, No. 8; pp. 1478–1480; Aug. 1997.
Biernacki et al.; A Two–Channel Optical Downconverter for Phase Detection; IEEE Trans. on Micro. Theo and Tech.; vol. 46 No. 11; pp. 1784–1787; Nov. 1998.

* cited by examiner

Primary Examiner—John D. Lee
(74) Attorney, Agent, or Firm—John J. Karasek; John Gladstone Mills, III

(57) ABSTRACT

An image rejecting microwave photonic downconverter uses a microwave sub-carrier modulation technique without concern for image frequency interference in the shifted signal, thereby allowing telecommunications systems to downconvert densely multiplexed communications channels into a low frequency band where conventionqal electronics can perform signal-processing functions. The image rejecting microwave photonic downconveter incoming microwave signals can be processed without ambiguity in direction finding applications, allowing remotable, multioctave microwave signal processing for frequency and phase determination. A first laser providing an optical carrier that is modulated by a first electro-optic modulator with a sinusoidal electrical signal generated by a first local oscillator and a second laser providing optical carrier that is modulated by a second electro-optic modulator with a sinusoidal electrical signal generated by the second local oscillator for a signal generated by a second local oscillator; are transmitted independently through two polarization-maintaining (PM) optical fibers of arbitrary length to a distant point. There the first modulated optical signal is converted to an electrical domain and mixed with an input from an ultra-broadband radio frequency (RF) antenna receive-array, shifting the entire RF band to a higher frequency band equal to the original RF signal plus the modulated optical frequency signal.

18 Claims, 4 Drawing Sheets

IMAGE REJECTING MICROWAVE PHOTONIC DOWNCONVERTER

BACKGROUND OF THE INVENTION

1. Field of the Invention

This invention pertains generally to a device for shifting microwave signals in the direct current (DC) to 20 GHz range to an arbitrary intermediate frequency between DC and 20 GHz without interference between the original and converted signals, and more specifically to a device that prevents the image-sideband associated with the intended frequency side-band to be converted to an intermediate frequency band between DC and 20 GHz.

2. Description of the Related Art

There are generally two types of conventional microwave components that may provide significant frequency translation with image rejection; the digital phase modulator and the electronic image rejection mixer. In the case of the digital phase modulator, a Serrodyne phase modulated waveform is applied to the desired electrical signal to be shifted. SEE, Cumming, THE SERRODYNE FREQUENCY TRANSLATION, Proc. of the IRE, Vol. 45, pg. 175, 1957. The achievable image rejection is limited by the number of discrete electrical signals that can be implemented in hardware, usually less than ten. This limits the achievable rejection to below 25 dB. In the case of an electronic image rejection mixer, an oscillator is used to shift the original frequency. The achievable image rejection is limited by the ability to create, from the incoming broadband microwave signal, two broadband microwave signals exactly 90 degrees out of phase with exactly the same amplitude, independent of the incoming frequency. Typical devices with 3-degree phase error and a 0.25 dB amplitude imbalance are limited in their image and carrier rejection to less than approximately 30 dB.

The electrical frequency in the existing prior art can usually operate only over a narrow bandwidth due to engineering complexities. In the mixer example, it becomes very difficult to phase and amplitude match over a broad bandwidth, therefore commercial devices are usually limited to instantaneous bandwidths of less than 1–2 octaves at microwave frequencies. In the phase shifter example, the tradeoff between creating many bits for good rejection is not compatible with broadband operation because of the many paths the signal takes; therefore commercial devices are usually limited to instantaneous bandwidths of less than 12 GHz. Currently the state of the art in optical modulator bandwidth is above 75 GHz, which is significantly above commercially available electrical mixer or phase shifter products.

BRIEF SUMMARY OF THE INVENTION

The object of the invention is to provide a device for up-converting broadband electrical signals, filtering-out image frequencies in the electrical domain and then down-converting the desired frequency using optical techniques.

Another object of this invention is to obtain a frequency shifted microwave signal utilizing electro-optic modulators and band-pass electronic filters.

Another objective of this invention is to provide an analog device that does not rely upon phase or amplitude matching to achieve image rejection.

These and other objects of the invention are accomplished by an image rejecting microwave photonic downconverter using a microwave sub-carrier modulation technique without concern for image frequency interference in the shifted signal, thereby allowing telecommunications systems to downconvert densely multiplexed communications channels into a low frequency band where conventional electronics can perform signal-processing functions. Further, with the image rejecting microwave photonic downconverter, incoming microwave signals can be processed without ambiguity in direction finding applications, allowing remotable, multioctave microwave signal processing for frequency and phase determination. A plurality of lasers, a first laser providing an optical carrier that is modulated by a first electro-optic modulator with a sinusoidal electrical signal generated by a first local oscillator (LO) and a second laser providing an optical carrier that is modulated by a second electro-optic modulator with a sinusoidal electrical signal generated by the second local oscillator; are transmitted independently through two polarization-maintaining (PM) optical fibers of arbitrary length to a distant point. At the distant point, the first modulated optical signal is converted to the electrical domain using a photodetector and mixed with an input from an ultra-broadband radio frequency (RF) antenna receive-array, shifting the entire RF band to a higher frequency band equal to the original RF plus the LO frequency. This upshifted frequency band is amplified and passed through a band-pass filter to attenuate frequencies outside the up-converted pass-band. The filtered signal is electro-optically mixed with the modulated optical signal from the second local oscillator using a $3^{rd}$ modulator and the resulting intermediate frequency (IF)-modulated optical signal is detected using a second photodetector and transmitted to an electrical output port of the system.

DETAILED DESCRIPTION OF THE INVENTION

Figure 1:
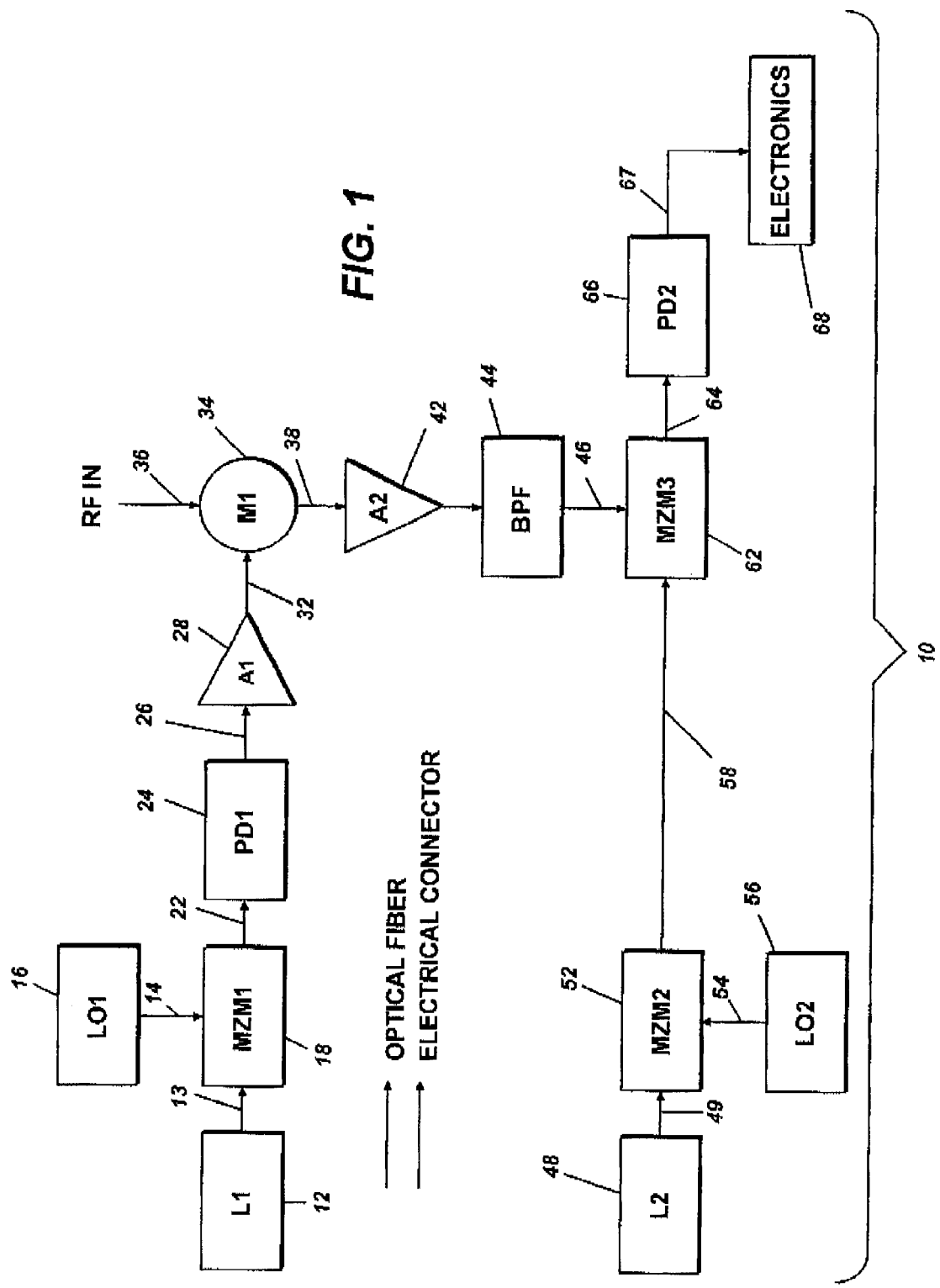
FIG. 1 shows a block diagram of an image rejecting optical downconverter.

In the preferred embodiment of the image rejecting microwave photonic downconverter 10, as shown in FIG. 1, a first laser 12, L1, provides an optical carrier 13 at a wavelength $\lambda_1$ which is modulated by a sinusoidal electrical signal 14 generated by a local oscillator 16, LO1, in a first optical modulator 18, MZM1, such as a Mach-Zehnder optical modulator, to produce a first modulated optical carrier 22 which is applied to a first high speed photodetector 24, PD1, where the optical carrier 22 is converted to an electrical signal 26, which in turn is amplified by a first amplifier 28, A1 and drives an upconverting mixer 34. The modulated optical carrier 22 is carried from MZM1 18 to PD1 24 by a polarization-maintaining (PM) optical fiber. In the electronic mixer 34, M1, the amplified signal 32 is mixed with an analog ultra-broadband radio frequency (RF) signal 36 from a remote antenna receive-array (not shown)to produce a up-shifted frequency band signal 38. The mixer 34 acts to shift the entire RF band to a higher frequency band equal to the original RF frequency plus the frequency of LO1. This up-shifted frequency band signal 38 is amplified in a second amplifier 42, A2, and applied to an electronic band pass filter 44, BPF, which attenuates frequencies outside the up-converted pass-band.

A second laser 48, L2, centered at wavelength $\lambda_2$ provides a second optical carrier 49 which is modulated by a sinusoidal electrical signal 54, generated by a second local oscillator 56, LO2, in a second optical modulator 52, MZM2, also a Mach-Zehnder optical modulator, to produce a second electro-optically modulated carrier 58.

The filtered up-shifted frequency band signal 46 from the band pass filter 44 is electro-optically mixed in a third optical modulator 62, MZM3, with the optically-carried signal 58 from LO2 56, which shifts (downconverts) the filtered up-shifted frequency band signal 46 to a lower intermediate frequency (IF) signal 64. This IF band signal 64 is detected by using a second photodetector 66, PD2, and transmitted to the electrical outport of the system for application to user electronics 68.

The lasers 12 and 48 are of a relatively low intensity level and, preferably, are shot noise limited. A semiconductor distributed-feedback (DFB) laser has been found to be adequate for the system, however any laser meeting the requirements may be used. Also, a single mode laser is preferred, however a multimode laser may be utilized. The only restriction is that the laser be low noise.

The optical fibers connecting MZM1 18 with PD1 24 and MZM 62 with PD2 66 are single mode fibers, however, prior to the modulators 18, 52, and 62, the optical fiber is a polarization preserving optical fiber because MZM1 18, MZM2 52 and MZM3 62 are polarization sensitive.

The first and second modulated optical carriers 22 and 58, respectively, may be transmitted independently by two polarization-maintaining (PM) optical fibers of arbitrary length because the local oscillators 16 and 56 are at different frequencies. In the case of thermal fluctuations, or other irregularities, the phase does not have to be kept constant between the outputs 22 and 58 of the modulators 18 and 52 because of the lack of any phase relationship between the two local oscillators LO1 16 and LO2 56.

LO1 16 and LO2 56 have low phase noise characteristics. In this application, any local oscillator of decent quality may be used, such as a cavity oscillator. However, it is noted that LO1 16 is tunable and acts to translate a desired portion of the received RF frequency band through the bandpass filter. LO2 56 need not be tunable. The purpose of LO1 16 being tunable is that it shifts the RF input frequency 36 into the pass band of the bandpass filter 44. The LO1 16 frequency is determined by the RF input signal 36 frequency range, DC to 18 GHz, at the input, and on the frequency range of the bandpass filter 44. In order to avoid overlap between the original RF input band 36 and the filter passband 44 at the output of the electronic mixer 34 (similar to the unisolated RF indicated in FIG. 2b), the filter 44 is chosen so that the lower limit of the filter passband is a few GHz higher than the maximum RF input 36 frequency. In addition, LO isolation becomes a concern as the minimum RF input 36 frequency approaches DC because the LO frequency required to upconvert will approach the lower limit of the filter passband. As the RF input frequency of interest 36 increases from low frequencies to high frequencies, the frequency of LO1 16 is decreased from its maximum by the same amount so that the corresponding upconverted frequency 38 lies within the filter passband 44. The frequency of LO2 56 is constant because the desired portion of the upconverted mixer output 38 is always within the fixed filter passband.

LO1 16, as previously stated, is tunable and acts to translate, in the frequency domain, a desired portion of the received RF frequency band 36 through the bandpass filter 44. In this way, different regions of the RF band 36 can be transmitted through the filter 44 and down-converted to the IF band 67. Because of the excellent RF to IF isolation of the system 19 due to a 50 to 80 dB filter 44 rejection, the IF band 67 can exist in any frequency range, as long as the maximum frequency of the IF band 67 is less than the LO2 56 frequency. The width of the IF band 46 is determined by the width of the bandpass filter 44. Image and fundamental carrier rejection is achieved because those frequency bands are attenuated by the band-pass filter 44, and therefore are not down-converted to the IF band 67.

The only specific requirement for the photodetectors PD1 24 and PD2 66 is that they have enough bandwidth to cover the IF frequency range of the device.

The mixer 34 is a triple balance mixer so as to provide ultra-wideband capability; it must have a large bandwidth signal capability at the input and convert the RF signal 36 to a broadband signal at the output 38 so as to provide a signal that is easily processed by the present day electronics. This requirement is well known to those skilled in the art for a receive system. However, the mixer may be of any type well known to those skilled in the art as long as it covers the input frequency range desired. Therefore, if you only want to look at a few GHz, then a double-balanced or a single-balanced mixer may be used.

The amplifiers, A1 28 and A2 42, are typically an ultra-wideband and a narrowband amplifier, respectively. The first amplifier A1 28 must cover the range of possible LO1 16 frequencies. The second amplifier, A2, 42 has to be at least as wide as the filter bandpass 44. Therefore, the amplifier must typically be wider to assure that the original Rf frequency passes through the bandpass filter 44.

Typically the bandpass filter 44 is a cavity filter with good rejection through the RF frequency range, low loss within the bandpass frequency range and an attenuation of from 60 to 70 dB. Therefore, a typical cavity filter with a DC to 18 GHz range is suitable for the bandpass filter 44.

Figure 2A:
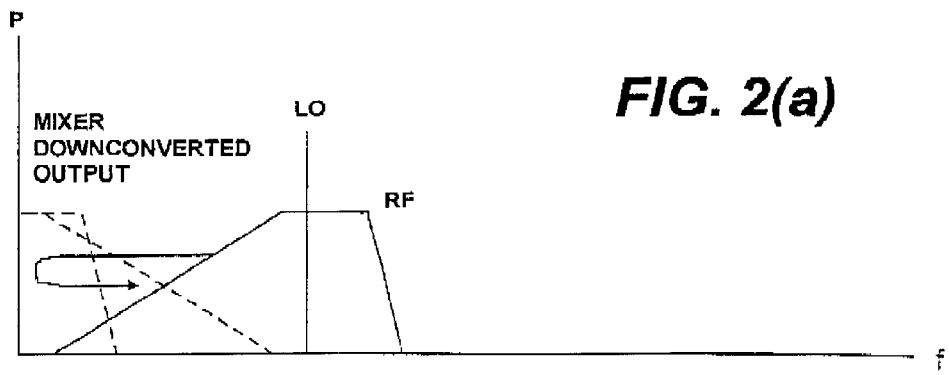
FIG. 2a shows the mixing that occurs between the radio frequency signal and the injected signal from the first local oscillator.
Figure 2B:
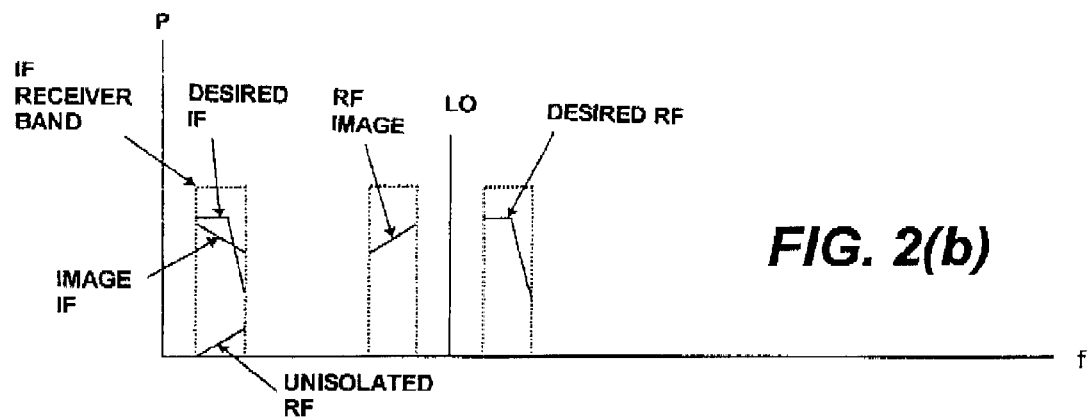
FIG. 2b shows the superposition of desired and undesired components within the IF output band.
Figure 2C:
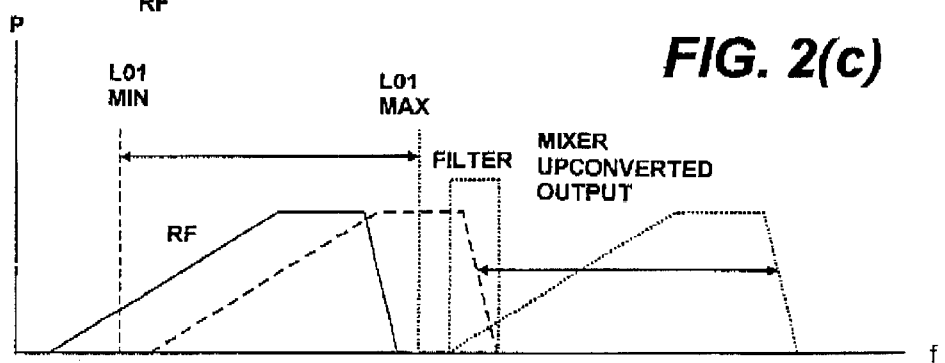
FIG. 2c shows that by using a two-step frequency shift, the original radio frequency band is upconverted using the first local oscillator signal so that only the desired portion of the band passes through a bandpass filter.
Figure 2D:
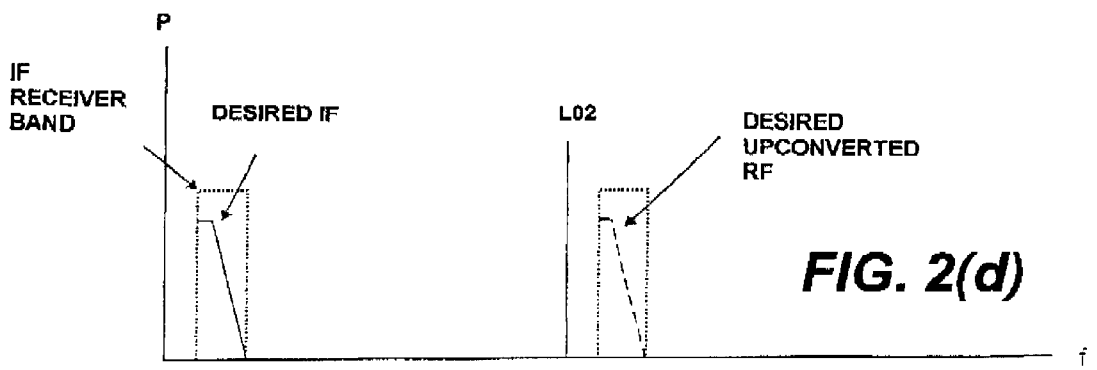
FIG. 2d shows the filtered output of the upconverted RF upon leaving the bandpass filter downconverted to the desired IF frequency range using a fixed second local oscillator carrier.

FIGS. 2a through 2d depict a graphical representation of the traditional and image rejecting downconverter input signals. FIG. 2a shows the mixing that occurs between the radio frequency signal and the injected signal from the first local oscillator. FIG. 2b shows the superposition of the resulting mixer IF output. FIG. 2c shows that by using a two-step frequency shift, the original radio frequency band is upconverted using the first local oscillator signal so that the desired portion of the band passes through a bandpass filter. FIG. 2d shows the filtered output of the upconverted RF upon leaving the bandpass filter downconverted to the desired IF frequency range using a fixed second local oscillator carrier. It should be noted that, while each of FIGS. 2a through 2d depicts either an upconversion or downconversion for simplicity, the fact is that both upconversion and downconversion occur in each mixing process.

Figure 3:
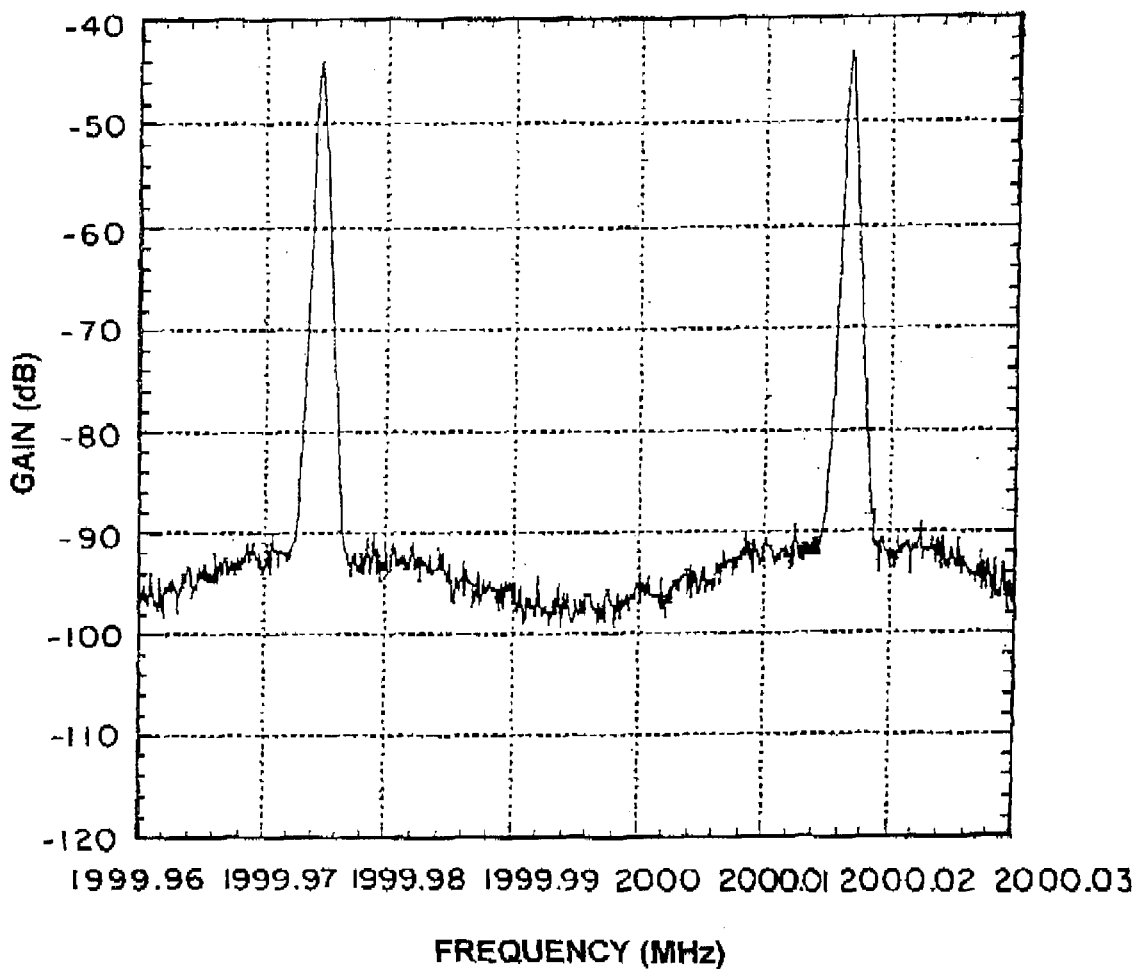
FIG. 3 shows both a desired signal and an image at the output of the system when the bandpass filter is removed.
Figure 4:
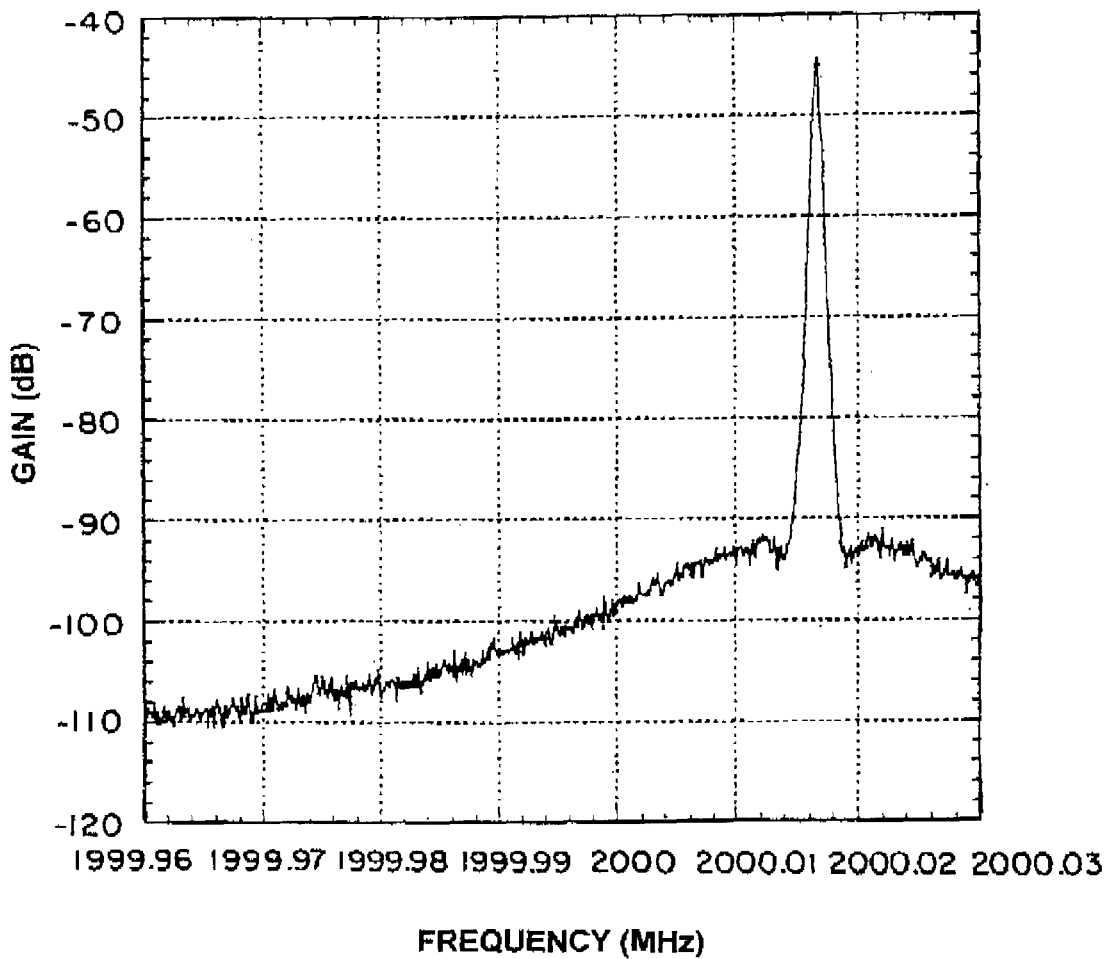
FIG. 4 shows a greatly attenuated image when the bandpass filter is inserted.

However, only one of these processes will be relevant in each case due to the selectivity of the filter or RF receiver. FIG. 3 shows both a desired signal and an image at the output of the system when the bandpass filter is removed. FIG. 4 shows a greatly attenuated image when the bandpass filter is inserted.

The information shown in FIGS. 3 and 4 was obtained in an application of the image rejecting downconverter using a Hewlett Packard (HP) 8510C network analyzer system and an HP 8563 spectum analyzer. Two tones were applied to the RF input 36 of the system using isolators and a 3-dB microwave coupler. One tone was set to a center frequency of 6000 MHz, representing the desired RF signal, and the second "undesired" tone was set to a center frequency of 2000 MHz plus a small offset of 40 MHz. Since the "undesired" image tone would be downconverted to the same output IF frequency 67, with LO1–LO2 set to 4000 MHz, the small offset was added to distinguish between the image and the desired signal. Following the signal path through the system, the two RF tones are upconverted with LO1 16 set to 15.3 GHz. Thus, the tone representing the lower sideband is shifted to 17.3 GHz. The passband of the filter is between 21.3 and 23.3 GHz. LO2 56 was set to 19.3 GHz which downconverts both the 21.3 GHz tone and the 17.3 GHz tone (the image) to 2 GHz, separated by the 40 MHz offset. FIG. 3 shows that both the desired signal and the image appear at the output 67 port of the system (IF2) when the bandpass filter 44 is removed. FIG. 4 shows that the image is greatly attenuated when the filter 44 is inserted, with very little attenuation of the desired RF. This test demonstrates both image rejection and RF to IF isolation of approximately 60 dB.

The invention described herein provides image rejection of greater than 60 dB across more than 12 GHz, exceeding commercial devices by 25 to 45 dB. By virtue of low-loss optical fibers, this invention allows the lasers and local oscillators to be separated by several kilometers from the remainder of the system. Thus this system may be implemented using a remote antenna site, which is advantageous in many situations.

With traditional downconverting systems, the IF bandwidth is limited to the region outside the RF band due to RF-to-IF isolation considerations. For a 0.1–18 GHz system, this would allow for only a DC-100 MHz downconverted IF band. SEE, Linsay et al., PHOTONIC MIXERS FOR WIDEBAND RF RECEIVER APPLICATIONS, IEEE Trans. MTT, Vol 43, No. 9, pp. 2311–2317, September 1995 and Gopalakrisnan et al., IEEE Trans. MTT, Vol. 43, No. 9, pp. 2318–2323, September 1995. This invention allows the IF band to exist within the RF band, without interference, by using a two-step frequency shift technique and band-pass electronic filters.

With the microwave-photonic image rejecting downconverter, it is also possible to implement microwave sub-carrier modulation techniques without concern for image frequency interference in the shifted signal. SEE, Chao et al., IEEE Trans. MTT, Vol 45, No. 8, pg. 1478, 1997. This allows telecommunications and CATV systems to downconvert densely multiplexed communications channels into a low frequency band where conventional electronics can perform signal-processing functions.

Another feature is highlighted by considering the photonic link noise figure (NF). Assuming a 50-ohm, shot noise limited system, the relationship between NF, detector current, and modulator half-wave voltage, $V_\pi$, is as described in Williams et al., OPTICALLY AMPLIFIED DOWNCONVERTING LINK WITH SHOT-NOISE-LIMITED PERFORMANCE, IEEE Photonics Tech. Lett., Vol. 8, No. 1, pp. 148–150, January 1996. Also SEE, Nichols et al., OPTIMIZING THE ULTRAWIDE-BAND PHOTONIC LINK, IEEE Trans. MTT, Vol. 45, No, 8, pp. 1348–1389, August 1997. From this analysis a typical photodetector current and $V_\pi$ of 4 mA and 10 V, respectively, a noise figure well above a desired maximum NF of 15 dB is predictable Therefore, barring any advances in modulator $V_\pi$, phase matched preamplifiers are necessary at an antenna array to sufficiently decrease the noise figure of the system.

Since the invention mixes RF signals to a relatively narrow passband, the phase matching requirements normally encountered are eliminated for coherent or incoherent applications. This invention makes phased matched direction finding arrays much more practical due to the reduced sensitivity requirements of the modulators 18, 52 and 62. In traditional phase sensitive direction finding (DF) arrays which use optical modulators at the antenna site, the use of phase and amplitude matched preamplifiers over the entire RF bandwidth is necessary to achieve low noise figures. This invention relaxes those requirements since phase and amplitude matched amplifiers are only required over the desired filter pass-band, which in turn, is only as wide as the desired IF processing bandwidth. This is a subtle, but very important, advantage of this invention.

Referring again to FIG. 1, an electro-optic modulator (e.g., Mach-Zehnder modulator) can perform the mixing function of the conventional microwave mixer 38, M1. Also, the two modulated optical carriers 22 and 58 may be combined onto a single PM optical fiber (assuming the optical carriers are of different wavelengths) using wavelength division multiplexing (WDM) techniques well known to those skilled in the art. The two modulated optical carriers 22 and 56 are subsequently de-multiplexed at the remote site onto separate PM optical fibers using the well-known WDM techniques.

By virtue of the low-loss optical fibers, this invention allows the lasers and local oscillators to be separated by as much as 10 km, or more, from the remainder of the system. Thus, this system may be implemented using a more remote antenna site, which is advantageous to many commercial communication and radar applications.

Further, this invention maintains a known phase relationship between the local oscillators 16 and 56 and the received Rf signal 13. This allows the image rejection system to be used in direction finding systems.

Although the invention has been described in relation to an exemplary embodiment thereof, it will be understood by those skilled in the art that still other variations and modifications can be affected in the preferred embodiment without detracting from the scope of the invention as described in the claims.

What is claimed is:

1. An image rejecting microwave photonic downconverter comprising:

a first optical carrier comprised of a first optical signal with a signal generated by a tunable first local oscillator imposed thereon converted to a first electrical signal;

a second optical carrier comprised of a second optical signal with a signal generated by a second local oscillator imposed thereon;

a device for mixing a first electrical signal with a radio frequency signal to produce a first intermediate frequency signal band;

a filter for filtering said first intermediate frequency signal band to remove an upper sideband and any signal images present thereon;

an optical modulator for shifting said first filtered intermediate frequency signal band when applied to said second optical carrier resulting in a downconverted second intermediate frequency signal band; and a device for converting said second intermediate frequency signal band to an electrical signal for application to utilizing electronics.

2. The downconverter, as in claim 1, wherein said device for converting the first optical signal to a first electrical signal is a photodetector.

3. The downconverter, as in claim 1, wherein said device for mixing the first electrical signal with the radio frequency signal to produce a first intermediate frequency signal band is an upconverting mixer.

4. The downconverter, as in claim 1, wherein said filter is a bandpass filters.

5. The downconverter, as in claim 4, wherein the bandpass filter is a cavity filter.

6. The downconverter, as in claim 4, wherein the device for shifting said first filtered intermediate frequency signal band when applied to said second optical carrier resulting in a downconverted second intermediate frequency signal band is an interferometric optical modulator.

7. The downconverter, as in claim 1, wherein the optical modulator is a Mach-Zehnder optical modulator.

8. An image rejecting microwave photonic downconverter comprising:

a first and second laser, each laser producing a respective first and second optical signal;

a first and second electro-optic modulator associated respectively with the first and second optical signal;

a first and second local oscillator associated respectively with the first and second electro-optic modulator producing a first and second sinusoidal electrical signal applied through the first and second electro-optic modulators superimposed on the first and second optical signal;

means for transmitting said first and second optical signals with the superimposed first and second sinusoidal electrical signal to a distant point;

means for converting the first optical signal modulated with the first sinusoidal electrical signal from the optical domain to an electrical domain;

means for mixing said converted first optical signal modulated with the first sinusoidal electrical signal with an ultra-broadband radio frequency signal from an antenna receive array so as to upconvert the entire radio frequency band to a higher frequency band equal to the original radio frequency plus the frequency of the first local oscillator;

means for amplifying the up-converted signal;

means for band-pass filtering the upconverted signal to attenuate frequencies outside of the up-converted passband;

means for mixing the second optically modulated signal with the up-converted signal to down-convert the filtered signal to a lower intermediate frequency; and means for converting the mixed optical signal to an output electrical signal.

9. An image rejecting microwave photonic downconverter comprising:

a first and second laser, each laser producing an optical signal;

a first and second electro-optic modulator associated respectively with the first and second optical signal;

a first and second local oscillator associated respectively with the first and second electro-optic modulator producing a first and second sinusoidal electrical signal applied through the first and second electro-optic modulators superimposed on the first and second optical signal;

means for converting the first optical signal modulated with the first sinusoidal electrical signal from the optical domain to an electrical domain;

means for transmitting said first and second optical signals with the superimposed first and second sinusoidal electrical signal to a distant point;

means for mixing said converted first optical signal modulated with the first sinusoidal electrical signal with an ultra-broadband radio frequency signal from an antenna receive array so as to upconvert the entire radio frequency band to a higher frequency band equal to the original radio frequency plus the frequency of the first local oscillator;

means for amplifying the up-converted signal;

means for band-pass filtering the upconverted signal to attenuate frequencies outside of the up-converted passband;

means for mixing the second optically modulated signal with the up-converted signal to down-convert the filtered signal to a lower intermediate frequency; and means for converting the mixed optical signal to an output electrical signal.

10. The downconverter, as in claim 9, wherein the device for superimposing a first a first and second sinusoidal electrical signal on the first and second optical signal is an interferometric optical modulator.

11. The downconverter, as in claim 9, wherein the means for transmitting said first and second optical signals with the superimposed respective first and second sinusoidal electrical signal to a distant point is an optical fiber.

12. The downconverter, as in claim 11, wherein the optical fiber is a polarization maintaining optical fiber of arbitrary length.

13. The downconverter, as in claim 9, wherein the means for mixing said converted first optical signal modulated with the first sinusoidal electrical signal with an ultra-broadband radio frequency signal from an antenna receive array so as to upconvert the entire radio frequency band to a higher frequency band equal to the original radio frequency plus the frequency of the first local oscillator is an upconverting mixer.

14. The downconverter, as in claim 9, wherein the means for amplifying the up-converted signal is an electrical amplifier.

15. The downconverter, as in claim 9 wherein the means for band-pass filtering the upconverted signal to attenuate frequencies outside of the up-converted pass-band is a cavity filter.

16. The downconverter, as in claim 9 wherein the means for mixing the second optically modulated signal with the up-converted signal to down-convert the filtered signal to a lower intermediate frequency is an interferometric optical modulator.

17. The downconverter, as in claim 9 wherein the means for converting the mixed optical signal to an output electrical signal is a photodetector.

18. A method for image rejection in a microwave photonic downconverter comprising the steps of:

producing a first and second optical signal having different frequencies;

producing a first and second sinusoidal electrical signal superimposed respectively on the first and second optical signal;

transmitting said first and second optical signals with the superimposed respectively first and second sinusoidal electrical signal to a distant point;

converting the first optical signal modulated with the first sinusoidal electrical signal from the optical domain to an electrical domain;

mixing said converted first optical signal modulated with the first sinusoidal electrical signal with an ultra-broadband radio frequency signal from an antenna receive array so as to upconvert the entire radio frequency band to a higher frequency band equal to the original radio frequency plus the frequency of a first local oscillator;

amplifying the up-converted signal;

filtering the upconverted signal to attenuate frequencies outside of the up-converted pass-band;

mixing the second optically modulated signal with the up-converted electrical signal to produce a mixed optical signal; and converting said mixed optical signal to an output electrical signal at a lower intermediate frequency.

* * * * *